(12) United States Patent
Grand et al.

(10) Patent No.: US 10,998,457 B2
(45) Date of Patent: May 4, 2021

(54) CONTACTS FOR A PHOTOVOLTAIC CELL WITH TWO ACTIVE SURFACES

(71) Applicants: ELECTRICITE DE FRANCE, Paris (FR); CENTRE NATIONAL DE LA RECHERCHE SCIENTIFIQUE—CNRS—, Paris (FR); PARIS SCIENCES ET LETTRES—QUARTIER LATIN, Paris (FR)

(72) Inventors: Pierre-Philippe Grand, Saint-Maximin la Sainte Baume (FR); Daniel Lincot, Antony (FR)

(73) Assignees: ELECTRICITE DE FRANCE, Paris (FR); CENTRE NATIONAL DE LA RECHERCHE SCIENTIFIQUE—CNRS—, Paris (FR); PARIS SCIENCES ET LETTRES—QUARTIER LATIN, Paris (FR)

( * ) Notice: Subject to any disclaimer, the term of this patent is extended or adjusted under 35 U.S.C. 154(b) by 125 days.

(21) Appl. No.: 16/339,838

(22) PCT Filed: Oct. 4, 2017

(86) PCT No.: PCT/EP2017/075242
§ 371 (c)(1),
(2) Date: Apr. 5, 2019

(87) PCT Pub. No.: WO2018/065478
PCT Pub. Date: Apr. 12, 2018

(65) Prior Publication Data
US 2019/0296162 A1    Sep. 26, 2019

(30) Foreign Application Priority Data

Oct. 5, 2016 (FR) ...................... 16 59624

(51) Int. Cl.
C25D 3/38 (2006.01)
C25D 9/06 (2006.01)
(Continued)

(52) U.S. Cl.
CPC ........ H01L 31/022425 (2013.01); C25D 3/38 (2013.01); C25D 5/006 (2013.01);
(Continued)

(58) Field of Classification Search
CPC ........ C25D 9/06; C25D 17/002; C25D 7/126; C25D 5/006; H01L 31/1884
See application file for complete search history.

(56) References Cited

U.S. PATENT DOCUMENTS

2012/0132264 A1    5/2012   Chen et al.
2014/0109967 A1    4/2014   Min et al.
(Continued)

FOREIGN PATENT DOCUMENTS

CN    105590987 A    5/2016

*Primary Examiner* — Brian W Cohen
*Assistant Examiner* — Ho-Sung Chung
(74) *Attorney, Agent, or Firm* — Faegre Drinker Biddle & Reath LLP

(57) ABSTRACT

Fabrication of a double-sided photovoltaic cell, with two opposite active surfaces, comprising a step of depositing, on each active surface, at least one electric contact. The deposition step comprises in particular a shared operation of depositing on each of the active surfaces, implemented by electrolysis in a shared electrolysis tank comprising: a first compartment for depositing a metal layer on a first active surface of the cell, for fabrication of a contact comprising said metal layer on the first active surface; and a second compartment for depositing, by oxidation, a metal oxide conductor layer on the second active surface of the cell, for the fabrication of a contact comprising said metal oxide layer on the second active surface.

12 Claims, 3 Drawing Sheets

(51) Int. Cl.
  *C25D 7/12*      (2006.01)
  *C25D 5/02*      (2006.01)
  *H01L 31/0224*   (2006.01)
  *H01L 31/068*    (2012.01)
  *H01L 31/18*     (2006.01)
  *C25D 17/00*     (2006.01)
  *C25D 5/00*      (2006.01)

(52) U.S. Cl.
  CPC .............. *C25D 5/028* (2013.01); *C25D 7/126* (2013.01); *C25D 9/06* (2013.01); *C25D 17/001* (2013.01); *H01L 31/022466* (2013.01); *H01L 31/022475* (2013.01); *H01L 31/022483* (2013.01); *H01L 31/0684* (2013.01); *H01L 31/18* (2013.01); *H01L 31/1884* (2013.01); *Y02E 10/547* (2013.01)

(56) References Cited

U.S. PATENT DOCUMENTS

| | | | |
|---|---|---|---|
| 2014/0251817 A1* | 9/2014 | Vais | .................... H01L 31/1868 205/157 |
| 2016/0005903 A1 | 1/2016 | Wenham et al. | |
| 2017/0250295 A1 | 8/2017 | Ji et al. | |

* cited by examiner

CONTACTS FOR A PHOTOVOLTAIC CELL WITH TWO ACTIVE SURFACES

CROSS-REFERENCE TO RELATED APPLICATIONS

This application is the U.S. national phase of the International Patent Application No. PCT/EP2017/075242 filed Oct. 4, 2017, which claims the benefit of French Application No. 16 59624 filed Oct. 5, 2016, the entire content of which is incorporated herein by reference.

FIELD

The disclosure relates to the field of fabrication of photovoltaic cells, and more specifically relates to depositing contacts on such cells.

BACKGROUND

In the case for example where cells are silicon-based, the cells currently dominating the photovoltaic market are single-sided (only one surface receiving light rays) and the back surface is entirely metallized. All the same, with a goal of increasing photovoltaic conversion yields, the development of "double-sided" cells is currently experiencing a major expansion. In fact, in these structures with two opposite active surfaces, the efficiency of the panel is the sum of the yield obtained on the front surface (direct radiation) and that obtained on the rear surface (which only receives reflected radiation—about 20% of the light incident on grass for example). The order of magnitude of the conversion gain compared to a single-surface cell is therefore about 3 to 4%, depending on the reflection rate of the incident surface (e.g. grass, snow, sand, etc.). Nonetheless, the development of double-sided cells is slowed because of the high cost of their production and also performance limitations related in particular to the use of silver paste based screen printing for metallizing the metallic contacts.

An alternative to metallization by screen printing is the use of electrochemical plating, which is starting to be industrialized for single-sided cells. The general attraction of electrochemical plating over screen printing is:

from a performance perspective:
  Reducing the shadowing rate of the cell by reducing the size of the metallized pattern (width of the collecting fingers can be reduced over 50%);
  Allowing contact with very resistive (>120Ω) emitters;
  Improving the electrical conductivity and reducing the contact resistance with the emitter;
from an economic perspective:
  Eliminating (or greatly reducing) the quantity of silver and replacing it with copper (with a factor of 100 savings in the cost of the metal);
  Replacing screen printing with an electrochemical method (having a better rate of use of raw material).

Since electrochemical plating is not possible by conventional electrolysis (because the resistivity of silicon is too large), the most commonly used approach is a "mixed" approach of thickening of screen-printed contacts.

Some properties of the silicon substrate can also be stimulated and two current electrochemical techniques for direct plating on a silicon substrate are:
  deposit induced by light (Light Induced Plating or LIP); and
  deposit in the direction of polarization of the diode (Forward Bias Plating or FBP).

Light induced plating (LIP) is used for metallization of the $n^+$ surface. In this case, by illuminating the semiconductor, the p-n junction generates electron-hole pairs. By applying a potential between an anode on the rear surface ($p^+$) of the previously metallized photovoltaic cell, the electrons generated are used on the $n^+$ surface for reducing metal salts present in the deposit bath.

However, the "competition" on the $p^+$ surface between the formation of holes (related to the photo-generation of current) and the arrival of electrons for feeding the reduction reaction on the $n^+$ surface is incompatible with the formation of a compound by electrolysis on a double-sided cell. Thus, in a LIP type technique, the rear surface of the cell is often outside the electrolysis bath in order to prevent corrosion or over-deposit problems.

The technique of depositing in the direction of diode polarization (FBP) is used for metallization of the $p^+$ side. In this case, by connecting an anode to the rear surface of the solar cell ($n^+$), a cathode potential or current is applied to the previously metallized rear surface. This potential serves to generate electrons which pass through the diode and are available on the $p^+$ surface. However, here again, this technique cannot be used for double-sided cells because if both surfaces are exposed to the electrolytic bath, the application of the potential (or current) leads to the formation of a compound by reduction on the $n^+$ surface. The formation of this conducting compound then "blocks" the movement of electrons through the diode and only a deposit on the $n^+$ surface is produced.

Of course, a combination of both techniques (LIP and FBP) can be provided for the metallization of double-sided surfaces but this combination requires a burdensome and complex implementation (mandatorily sequential metallization, management of the electrical contact and field lines between the two surfaces, need for precise alignment between the openings of the two surfaces).

The only (electro-) chemical metallization technique with which to simultaneously deposit a metal on both silicon surfaces (one $p^+$ type and the other $n^+$ type) is a method referred to as "electroless" auto-catalytic. Nonetheless, it has disadvantages: implementation complexity, need for activation of the surface before depositing (often using a bath containing palladium, a costly metal), long deposition times (≈0.1 μm/minute), short bath life and delicate bath management, and all this is that a high deposition temperature (over 80° C.). Further, the deposition speed depends on the type of surface to be covered (with a different selectivity on the surfaces of the cell).

A simultaneous electrochemical deposition of the contacts for the front and rear surface of the double-sided cell is then preferred which is better suited in terms of ease of implementation, deposition speed, etc.

The present disclosure aims to improve this situation.

SUMMARY

For this purpose, an embodiment proposes a method for fabrication of a double-sided photovoltaic cell, with two opposite active surfaces, comprising a step of depositing, on each active surface, at least one electric contact. The deposition step comprises in particular a shared operation of depositing on each of the active surfaces, implemented by electrolysis in a shared electrolysis tank comprising:
  a first compartment for depositing a metal layer on a first active surface of the cell, for fabrication of a contact comprising said metal layer on the first active surface; and a second compartment for depositing, by oxidation, a metal oxide conductor layer on the second active surface of the cell, for the fabrication of a contact comprising said metal oxide layer on the second active surface.

For example, the metal in the metal oxide layer can be at least one element among Mn, Ni, Mo, Cd, Sn, In, Zn, Pb, Ag, Cu, In, Ga, Co, W, Ta, Ga and Ti.

More specifically, during the shared deposition operation:
electrons are generated in the first compartment, opposite the first active surface, for enhancing the deposit of the metal layer; and
holes are generated in the second compartment, opposite the second active surface, for enhancing the deposit by oxidation of the metal oxide layer.

In an embodiment, the first and second compartments are separated by an ion exchange membrane that the electrolysis tank comprises.

Preferably, the deposit:
of the metal layer on the first active surface; and
of the metal oxide layer on the second active surface,
is assisted by lighting of at least one of the first and second active surfaces.

In fact, the lighting enhances the generation of electron/hole pairs and therefore the simultaneous deposit of the metal layer and the metal oxide layer. This lighting can therefore be done on at least any one of the two surfaces.

Optionally, the depositing operation is assisted by application of a potential difference specific for generating at least negative charges on the first active surface.

Alternately or additionally, the depositing operation can be assisted by application of a potential difference specific for generating positive charges on the second active surface.

In an embodiment, the photovoltaic cell is a double-sided homojunction with $n^+$ type on the first active surface and $p^+$ on the second active surface.

The bulk material (also called substrate SUB below) can for example be n or p type silicon. The surfaces of the material however remain:
$p^+$ type on one surface; and
$n^+$ type on the other surface, opposite.

As indicated as an example above, the photovoltaic cell can be silicon-based.

In a possible implementation, the metal layer on the first active surface can be nickel-based, and the step of depositing the electric contact on this first active surface can be continued next by depositing a layer comprising at least copper onto the metal layer, by electrolysis. This solution is very advantageous economically because it serves to replace depositing a costly, silver paste usually done by screen printing.

The step of depositing the electric contact on the second active surface can be continued as well by depositing a layer comprising at least copper onto the metal oxide layer, by electrolysis (since the oxide is conducting).

As will be seen with reference to FIG. 1 discussed in detail later, the contact depositing step is preceded by a step of etching at least one electrically insulating layer ($SiO_2$, $SiN_x$), deposited on each active surface. This etching exposes each active surface in a region in which the aforementioned operation of simultaneous deposition by electrolysis can next be applied.

An embodiment also aims at a double-sided photovoltaic cell, with two opposite active surfaces, where the cell comprises at least one electrical contact on each active surface. Specifically, the contact for a first active surface comprises a metal layer deposited on the first active surface whereas the contact for the second active surface comprises a metal oxide conducting layer deposited on the second active surface.

The difference in the contact material between the two surfaces, with in particular:
one of metal, and
the other of conducting metal oxide,
mark a trace of the method on the cell obtained by implementing this method from the disclosure and also, such as cell can be obtained by implementation of the preceding method.

As indicated above, the photovoltaic cell can be homojunction type with $n^+$ type on the first active surface and $p^+$ on the second active surface.

BRIEF DESCRIPTION OF THE DRAWINGS

Other advantages and characteristics will appear upon reading the following detailed description of sample embodiments, and on examining the attached drawings on which.

DETAILED DESCRIPTION

In the sample embodiment presented below, the use of the semiconducting property of the P-N junction of the double-sided cell is proposed: the illumination of at least one of the two surfaces leads to the photogeneration of electron/hole pairs. Electrons are generated on the $n^+$ surface and holes on the $p^+$ surface. It is therefore possible to perform an electrochemical reaction of reduction on the $n^+$ surface (and therefore deposit a metal), and in parallel to enhance an oxidative electrochemical reaction on the opposite $p^+$ surface (and therefore deposit a metal oxide typically).

Thus, without need for connection to an external electric circuit, if the photovoltaic material of the cell (for example the silicon) is in contact with two adequate electrolytes (one per surface) it is thus possible to implement a simultaneous deposit:
on the $n^+$ doped surface: electrodeposition of a metal (for example nickel);
on the $p^+$ doped surface: electrodeposition of a metal oxide (for example, $MnO_2$, NiO, $MoO_3$, CdO, $SnO_2$, etc.).

Figure 1:
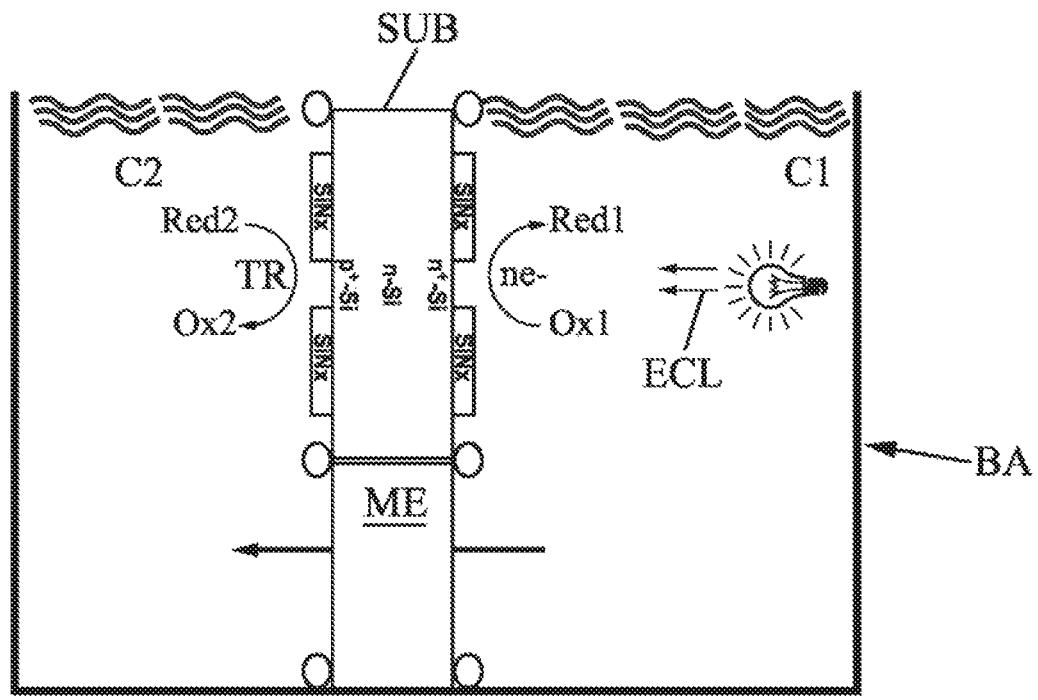
FIG. 1 shows an implementation for the fabrication of a cell by electrolysis according to an embodiment.

Thus, referring to FIG. 1, the substrate SUB (for example silicon), having photovoltaic properties and comprising opposite first and second active surfaces (respectively doped $n^+$ and $p^+$), is immersed in an electrolysis tank BA. An ion (anionic or cationic) exchange membrane ME is further provided in the extension of the substrate SUB for closing two respective compartments C1 and C2 in the tank. The illumination ECL of at least one of the surfaces enhances the photogeneration of electrons ne– on the first surface (in the compartment C1) and holes TR on the second surface (in the compartment C2). With the electrons in the compartment C1, metal (for example nickel, Ni) can be deposited on the free surface of the substrate (between the silicon nitride masks $SiN_x$). In parallel and in particular simultaneously, in the compartment C2, holes (positive charges) are created enhancing metal oxide deposition, and in particular deposition of a conducting oxide (for example, $MnO_2$ or another as presented later in the examples).

In particular, the metal oxide electrochemically deposited on the $p^+$ surface preferably has the following properties. It involves:

An electrical conductor equivalent within an order of magnitude to nickel ($14 \cdot 10^6$ S/m)

Forming an ohmic contact with the silicon

And a barrier to the diffusion of copper in the silicon

Without degrading under thermal treatment (range of 350 to 550° C.) for the subsequent steps of fabrication of the cell, While also minimizing the level of impurities (for example of carbon) in the resulting layer.

Further, if this oxide is transparent and conducting (like titanium oxide or ITO), electricity can be collected while allowing incident light to pass (reduced shadowing rate).

Preferably, on this oxide, copper can advantageously be deposited by electrolysis for increasing the conductivity of the electrical contacts. Next, a fine layer of silver can be deposited on the copper to protect it from oxidation and improve the weldability in order to fabricate assembled photovoltaic modules. Finally, a thermal treatment can be done so that NiSi can form on the $n^+$ surface, since NiSi has a role of ohmic contact on the silicon and in prevention of the diffusion of copper.

Figure 2:
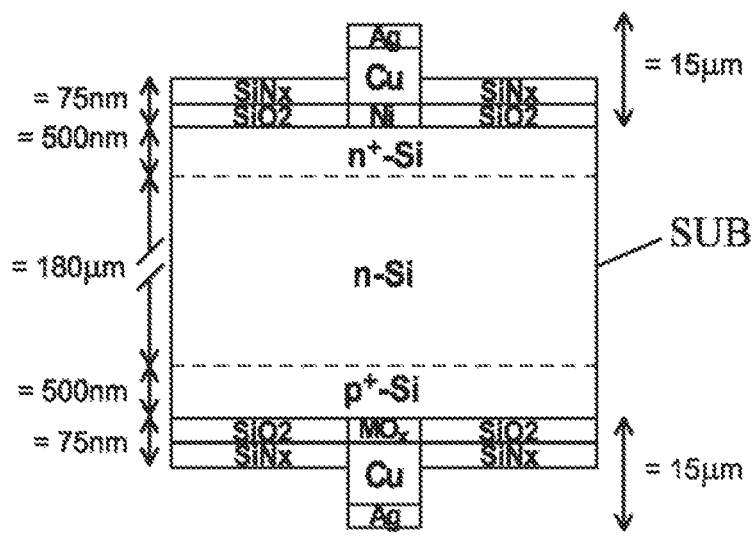
FIG. 2 shows an example of a cell according to an embodiment.

Thus, the solar cell can have a stack of the type illustrated in FIG. 2 (in a sample implementation relating to a double-sided cell, here of N-PERT type, for "Passivated Emitter, Rear Totally Diffused"), in which:

the reference $MO_x$ designates generally a metal oxide with M preferably, but without limitation, at least one of the elements: Mn, Cr, Fe, Co, Ni, Cu, Zn, Cd, W, Mo, In, Ga, Ta, and V. The noble metals (Pd, Pt, Au, and Ag) can also be considered, with however a higher fabrication cost;

the reference $SiN_x$ designates one or more silicon nitrides (and $SiO_2$ from the silica).

Using an electrochemical technique for the formation of the electric contacts has many advantages (compared to the usual technique, screen printing):

reduction of the fabrication cost (in particular by reduction of the quantity of silver to be deposited); and increased performance (contacts for very resistive emitters, improvement of shadowing rate, better conductivity).

Further, illuminating a photovoltaic substrate for depositing base metal layers (including an oxide) on both surfaces, simultaneously and without contact with an external circuit, by wet route also has advantages:

photocurrent generated by the diode can be used for electrodeposition of the metal and metal oxide.

connection to an external circuit is not necessary because the oxidation-reduction pair on each of the surfaces is directly at the photovoltaic substrate/electrolyte interface.

More precisely, again referring to FIG. 1, the phenomena used are:

photogeneration of electrons on the $n^+$ surface in contact with a reducible compound in the C1 compartment, with a reaction of the type: $Ox_1 + ne^- \rightarrow Red_1$ photogeneration of holes on the $p^+$ surface in contact with an oxidizable compound in the C2 compartment, with a reaction of the type: $Red_2 \rightarrow Ox_2 + ne^-$ In order to avoid acidification or alkalization of the compartments, an ion exchange membrane (Nafion type, anionic or cationic) can separate the two components and maintain the ionic equilibrium.

The illuminating device may comprise a row of diodes or halogen lamps having a maximum electromagnetic irradiation in the red visible or near infrared region. The radiation can preferably include the domain of ultraviolet optical wavelengths for activating and/or catalyzing the electrolyte/silicon interface in order to enhance nucleation at the silicon surface of the first deposition sites.

Depending on the electrochemical reactions brought into play, the illumination can advantageously be applied on both surfaces, so that the electrochemical potentials on both surfaces can be adjusted if needed.

Deposition speeds at least 10 times greater than those obtained by an autocatalytic type method (electroless method, the most effective currently known) can be achieved with the photogenerated current (of order of magnitude of several tens of $mA \cdot cm^{-2}$). The activation step from the electroless method (starting of the nucleation of the nickel Ni contact for example using palladium particles) is not needed. The electrolytic baths implemented are simpler and more stable than the electroless baths and purer deposits can be achieved (less carbon type impurities in the resulting film). The overall method is therefore faster and less costly than the electroless method, with equivalent photovoltaic performance.

More generally, the implementation in the meaning of the present disclosure presents many advantages compared to known techniques, such as the screen printing, electroless and LIP/FBP techniques. Already, the processing from the disclosure is simultaneous, quick and without electrical contact for both surfaces of the double-sided solar cells for the formation of electrical collection grids by preferably using illumination of one or both surfaces.

More specifically, compared to the electroless method, it is possible with the technique from the disclosure:

to incorporate less impurities (such as carbon or phosphorus) in the deposits;

to save fabrication time by simultaneously treating both surfaces at a high deposition rate;

to manage the bath more easily in terms of life of the bath, recharging, and deposition temperature.

Compared to the screen-printing method, the disclosure provides in particular an improvement of the performance of the photovoltaic devices by:

reducing the shadowing rate of the cell by reducing the size of the metallized pattern (width of the collecting fingers can be reduced over 50%);

improving contact with very resistive (>120Ω) emitters;

improving the electrical conductivity and reducing the contact resistance with the emitter.

and also fabrication savings by:

eliminating (or greatly reducing) silver by replacing it with copper;

replacing the screen printing by an electrochemical method (less burdensome).

Below, some specific implementation examples are presented:

In a first sample implementation presented below, $MnO_2$ and nickel are deposited simultaneously on the $p^+$ and $n^+$ surface respectively.

In a tank with two compartments separated by a Nafion cation exchange member, using a system of joints ensuring the sealing of both surfaces, a nickel metallization bath is placed in the $n^+$ compartment (C1) and an $MnO_2$ metallization bath in the p+ compartment (C2). The substrate (silicon) is illuminated with a row of white LED lights on one surface.

For depositing Ni, a temperature of 60° C. is applied for two minutes in a Watts bath. The nickel is deposited according to the following general reaction:

$$Ni^{2+} + 2e^- \rightarrow Ni$$

$$2H^+ + 2e^- \rightarrow H_2$$

In parallel, for depositing $MnO_2$, in a bath comprising 0.01 M Mn $(C_2H_3O_2)_2$ (called Mn acetate), 0.02 M $NH_4$ $(C_2H_3O_2)$ (called ammonium acetate) and 10% $C_2H_6OS$ (dimethyl sulfoxide (DMSO)), a temperature of 60° C. is applied for two minutes. The manganese oxide is then deposited at the anode according to the following general reaction:

$$Mn^{2+} + 2H_2O \rightarrow MnO_2 + 4H^+ + 2e^-$$

Advantageously, the protons (H+) can be balanced between the two compartments by the ion exchange membrane.

On both surfaces simultaneously, copper can next be deposited by direct electrolysis for increasing the conductivity of the electrical contacts. Next, a fine layer of silver can be deposited on the copper to protect it from oxidation and improve the weldability in order to fabricate photovoltaic modules. Finally, a thermal treatment (range from 350 to 550° C.) can be done so that a NiSi alloy can be formed on the n+ surface, which has a role of ohmic contact on the silicon and prevention of diffusion of the copper.

In a second embodiment, cadmium oxide CdO is deposited on the p+ surface, and nickel is deposited on the n+ surface.

CdO can be deposited at ambient temperature in 0.05 M cadmium acetate [Cd $(C_2H_3O_2)_2$] and 0.1 M $Na_2SO_4$.

The same operating mode is the one described in the first embodiment can next be applied (nickeling on the n+ surface, simultaneous coppering on both surfaces, silvering and then thermal treatment).

In a third embodiment, tin oxide $SnO_2$ is deposited on the p+ surface and nickel on the n+ surface, by providing 0.1 M $SnCl_2$ and 0.5 M $NaNO_3$ in DMSO.

In a fourth embodiment, manganese oxide $MnO_2$ is deposited on the p+ surface and nickel on the n+ surface with a single deposition bath because in this case, both surfaces of the substrate are exposed to the same electrolyte which contains at least one nickel salt (for example sulfate) and one manganese salt (for example an acetate). By application of standard potentials for electrochemical reactions, the reduction reaction of the nickel salt takes place at the cathode and the formation of the manganese oxide at the anode. In the case of a single bath, the ion exchange membrane is no longer necessary (ionic equilibrium is established by the exchange of protons between the reactions at the anode and the cathode).

Of course the present disclosure is not limited to the embodiments presented above as examples; it extends to other variants.

Figure 3:
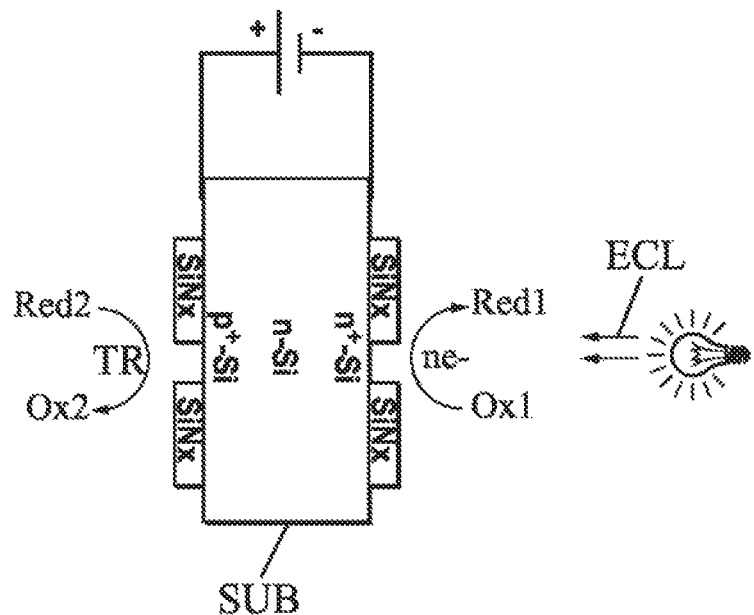
FIGS. 3 to 5 show alternative implementations to that from FIG. 1 for the fabrication of a cell by electrolysis according to an embodiment.

The principle of photogeneration of the current for example allows implementation variants. Typically, it can additionally be assisted by application of a potential between the p+ and n+ terminals of the substrate (preferred range of 0 to 2 V). The direction of polarization is shown in FIG. 3.

Figure 4:
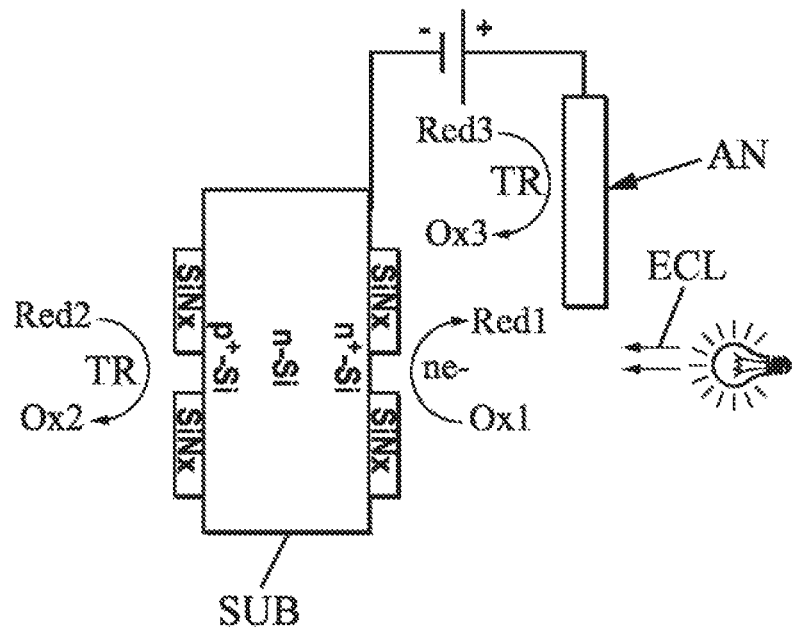

Again, alternatively, relating to this implementation, it is possible to provide an electrode specific to the reaction and different from the substrate. The principle of photogeneration of the current remains the same but is assisted by application of a potential between the n+ terminal of the substrate and an anode (preferred range from 0 to 2 V). The direction of polarization is described in FIG. 4. The anode can be soluble (for example nickel, advantageously) or insoluble (for example an oxide, $TiO_2/IrO_2$).

Figure 5:
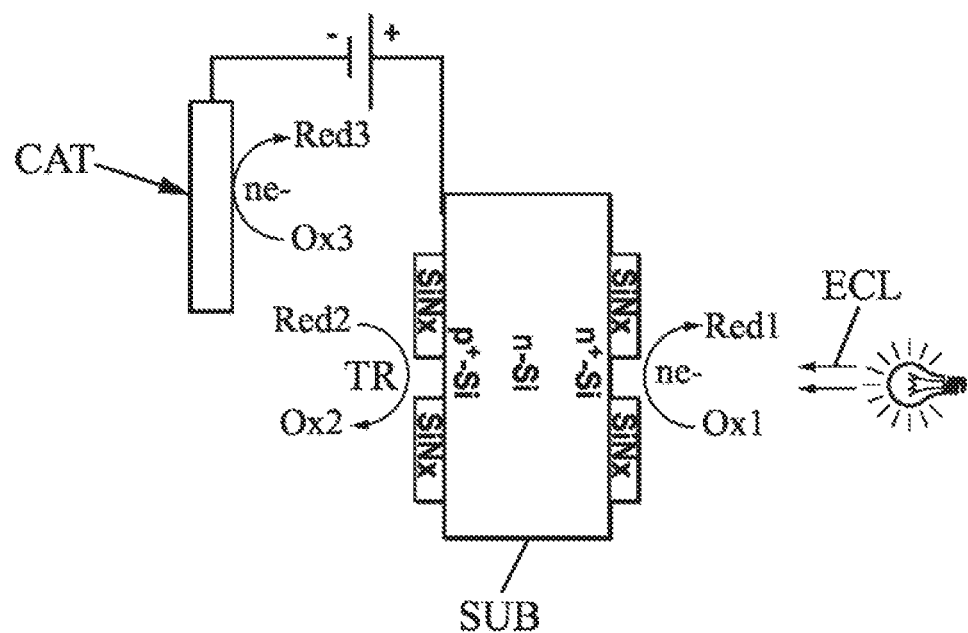

Alternatively again, the direction of polarization can be such as described in FIG. 5. In this case, the cathode is preferably insoluble (for example an oxide, $TiO_2/IrO_2$).

Further, the use of lightning for enhancing the reactions in both compartments of the electrolytic tank was described above. This implementation is advantageous in the case of a silicon substrate in particular. Just the same, it is not absolutely necessary for example for a substrate other than silicon. Typically, in some substrate cases, the electrical stimulation shown in one of FIGS. 3 to 5 could suffice for example.

The invention claimed is:

1. A method for fabrication of a double-sided photovoltaic cell, with two opposite active surfaces, comprising:
   depositing, on each active surface, at least one electric contact, by electrolysis in a shared electrolysis tank, said shared electrolysis tank comprising:
   a first compartment for depositing a metal layer on a first active surface of the cell, for fabrication of a contact comprising said metal layer on the first active surface; and
   a second compartment for depositing, by oxidation, a metal oxide conductor layer on the second active surface of the cell, for the fabrication of a contact comprising said metal oxide layer on the second active surface.

2. The method according to claim 1, wherein the metal in the metal oxide layer is at least one element among Mn, Ni, Mo, Cd, Sn, In, Zn, Pb, Ag, Cu, W, Ta, Ga, Fe, Co, Cr and Ti.

3. The method according to claim 1, wherein, during said depositing:
   electrons are generated in the first compartment, opposite the first active surface, for enhancing the deposit of the metal layer; and
   holes are generated in the second compartment, opposite the second active surface, for enhancing the deposit by oxidation of the metal oxide layer.

4. The method according to claim 1, wherein the first and second compartments are separated by an ion exchange membrane that the electrolysis tank comprises.

5. The method according to claim 1, wherein, the deposition of at least one of the metal layer on the first active surface and of the metal oxide layer on the second active surface is assisted by lighting of at least one of the first and second active surfaces.

6. The method according to claim 1, wherein the depositing operation is assisted by application of a potential difference specific for generating at least negative charges on the first active surface.

7. The method according to claim 1, wherein the depositing operation is assisted by application of a potential difference specific for generating positive charges on the second active surface.

8. The method according to claim 1, wherein the photovoltaic cell is a double-sided homojunction with n+ type on the first active surface and p+ on the second active surface.

9. The method according to claim 1, wherein the photovoltaic cell is silicon-based.

10. The method according to claim 1, wherein the metal layer on the first active surface is nickel-based, and the step of depositing the electric contact on the first active surface is continued by depositing a layer comprising at least copper onto the metal layer, by electrolysis.

11. The method according to claim 1, wherein the step of depositing the electric contact on the second active surface is continued by depositing a layer comprising at least copper onto the metal oxide layer, by electrolysis.

12. The method according to claim 1, wherein depositing the contact is preceded by etching at least one electrically insulating layer, deposited on each active surface said etching exposes each active surface in a region in which the operation of depositing by electrolysis is applied.

* * * * *